United States Patent

Mooradian

[11] Patent Number: 5,131,002
[45] Date of Patent: Jul. 14, 1992

[54] EXTERNAL CAVITY SEMICONDUCTOR LASER SYSTEM

[75] Inventor: Aram Mooradian, Winchester, Mass.

[73] Assignee: Massachusetts Institute of Technology, Cambridge, Mass.

[21] Appl. No.: 654,798

[22] Filed: Feb. 12, 1991

[51] Int. Cl.[5] ............................................. H01S 3/19
[52] U.S. Cl. ........................................ 372/50; 372/69; 372/92; 372/66
[58] Field of Search ...................... 372/50, 69, 64, 70, 372/92, 93, 66

[56] References Cited

U.S. PATENT DOCUMENTS

| | | | |
|---|---|---|---|
| 3,982,201 | 9/1976 | Rosenkrantz et al. | 331/94.5 P |
| 4,653,056 | 3/1987 | Baer et al. | 372/27 |
| 4,656,635 | 4/1987 | Baer et al. | 372/27 |
| 4,756,003 | 7/1988 | Baer et al. | 372/75 |
| 4,785,459 | 11/1988 | Baer | 372/75 |
| 4,794,615 | 12/1988 | Berger et al. | 372/69 |
| 4,837,771 | 6/1989 | Baer | 372/75 |
| 4,879,721 | 11/1989 | Braski et al. | 372/64 |
| 4,881,237 | 11/1989 | Donnelly | 372/50 |
| 4,894,839 | 1/1990 | Baer | 372/93 |
| 4,908,832 | 3/1990 | Baer | 372/75 |
| 4,942,582 | 7/1990 | Kintz et al. | 372/18 |
| 4,990,465 | 2/1991 | Liau et al. | 437/129 |

Primary Examiner—Léon Scott, Jr.
Attorney, Agent, or Firm—Hamilton, Brook, Smith & Reynolds

[57] ABSTRACT

An external cavity semiconductor laser system is disclosed wherein multiple segments of semiconductor material are excited with an array of pump sources. In one embodiment, a laser beam is reflected in a pattern to pass through multiple excited segments on a wafer of semiconductor material. In another embodiment, a series of wafers disposed in a laser cavity are excited. This pumping system spreads out the thermal load while providing a high power, high quality, laser beam.

36 Claims, 2 Drawing Sheets

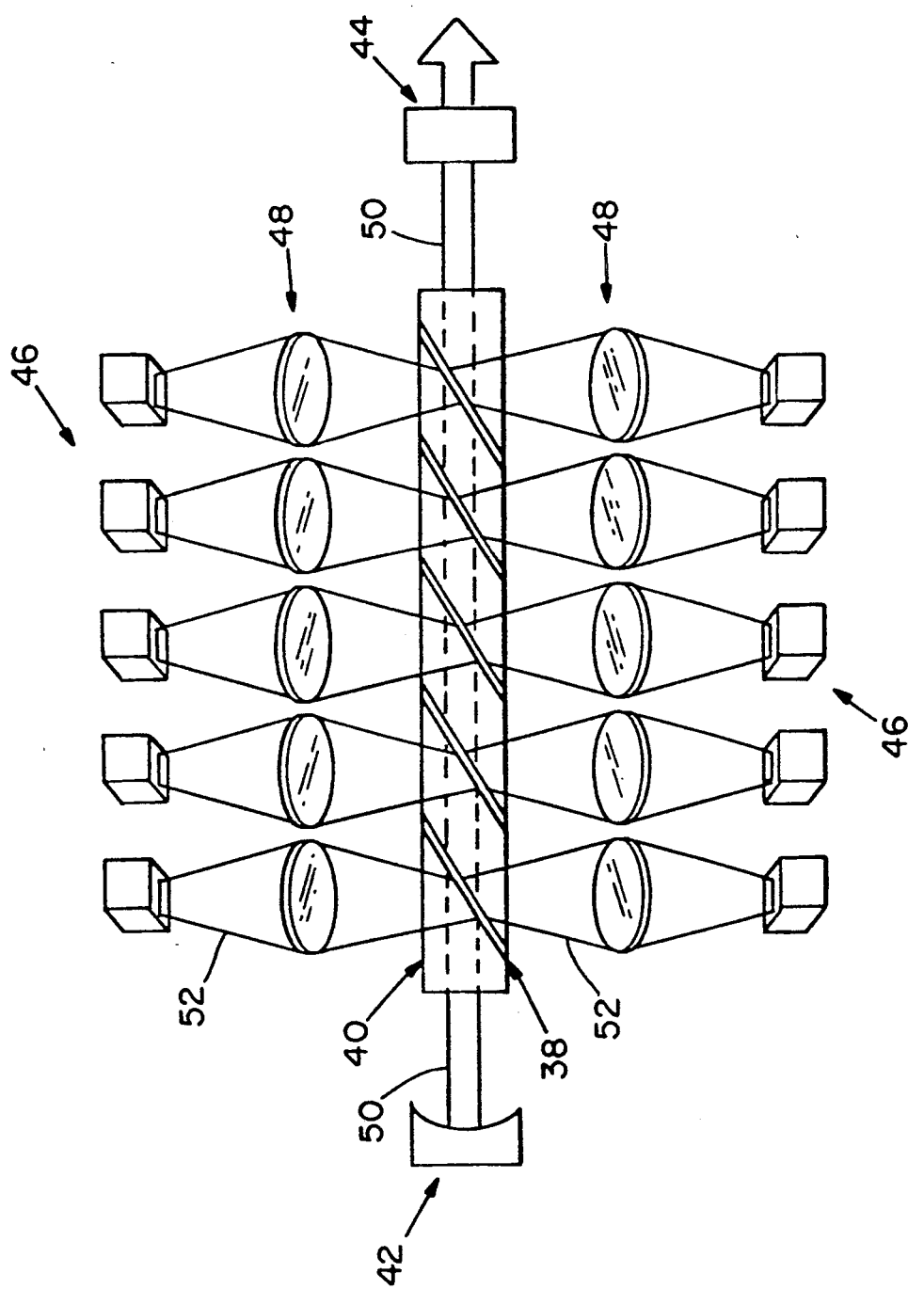

EXTERNAL CAVITY SEMICONDUCTOR LASER SYSTEM

BACKGROUND OF THE INVENTION

The term "laser" is an acronym for light amplification by stimulated emission. Stimulated emission occurs when an electromagnetic wave encounters atoms in material at high energy level $E_2$ and force the atom to a lower energy level $E_1$. The atoms undergoing this transition emit an electromagnetic wave in the process. The emitted wave adds to the incident wave and travels in the same direction. The process by which the atoms in the material are raised from a lower energy level $E_1$ to a higher level $E_2$, in order to be stimulated to emission, is called the pumping process.

Laser material is generally pumped either optically or electrically. The present invention is concerned with optical or electrical pumping of semiconductor lasers, i.e., lasers in which the active region of the laser consists of semiconductor (GaAs, GaAlAs, etc.) material.

Semiconductor lasers generally comprise a length of active laser material sandwiched between upper and lower cladding material.

Generally, optical pumping of solid state lasers is accomplished by directing a beam of light from a laser diode at the longitudinal edge of the laser material. Electrical pumping occurs by application of a voltage across a p/n junction of light emitting material to inject electrons and holes and obtain population inversion.

Lasers may be formed with either an internal cavity or an external cavity. An internal cavity laser is formed by cleaving the longitudinal ends of the laser material and forming optical mirror surfaces at each end, so light is reflected back and forth through the active material and eventually emitted out one end or facet of the laser.

In an external cavity laser structure, a first facet is coated with a multilayer, high reflection coating and the opposite second facet is coated with an antireflection (AR) coating. A lens is positioned to collimate light emitted from the AR coated facet. The collimated light passes to a mirror which is preferably located at the focal point of the lens. Optical feedback from the mirror to the laser is used to control the frequency and modality of the laser light emitted out the first facet.

This present invention relates to external cavity semiconductor laser systems.

SUMMARY OF THE INVENTION

Many efforts have been made to extract high power from two-dimensional semiconductor laser arrays. Most of these techniques have attempted to coherently combine many emitting elements in parallel. Coherent combining of many elements has had serious problems including difficulty in maintaining coherence across a large number of emitting elements. Here is described a system which can serially and coherently combine the power from many elements, each emitting in series. These elements may be excited by optical, electrical or electron beam pumping. The series operation of multiple elements insures that only a single coherent mode can propagate in all of the elements. By spreading the power over many elements in series, the thermal load per element will be maintained at a minimum level and the total power can be scaled to high levels ($>100$ W average and $>5$ kW peak).

Semiconductor lasers of the simple diode variety are not scalable to high average/peak power by themselves. Such devices have emitting areas that are generally thin and wide. Typical emitter dimensions are one micrometer by a few hundred micrometers and have a large beam divergence because of the thin emitting region. The peak power from semiconductor lasers is limited by the catastrophic degradation (typically several MW/cm$^2$). Such edge emitting diode lasers would therefore be limited to a peak power of about 10 watts. In addition, single diode lasers when operated at these power levels typically produce multimode radiation. The present invention eliminates these problems and allows scaling to much higher power levels.

In order to maximize the average output power, thin emitting or lasing elements are used such that the laser beam propagates normal to the surface of the element. The pump laser radiation is also incident on the surface of the element. The peak circulating power, and hence the output power, is limited by the area of an element disc, while the average power is spread over all of the elements.

Optically or electrically pumped semiconductor lasers typically use only a single semiconductor gain element. This limits the total gain and power dissipation capability of such systems. There is a need for semiconductor lasers with increased power that can also accommodate the correspondingly increased thermal load. The present invention comprises a system for pumping an external cavity semiconductor laser which meets these needs while providing high peak and average power in a high quality spatial beam.

In accordance with the invention, one or more semiconductor laser active gain regions are formed on a substrate. The regions are dielectrically insulated from each other such that light does not propagate laterally from one region to another. The regions may be formed in a length of active semiconductor material, such as GaAs, sandwiched between light transparent cladding layers, such as AlGaAs, with ion bombardment or etching applied around the active regions to form lossy isolation moats surrounding the active regions. The substrate preferably comprises a heatsink structure with a heat conductive mirror surface formed on it. The bottom laser cladding layer is disposed adjacent the mirror surface.

Pump sources are provided to excite the active segments or regions along the length of the active semiconductor material into population inversion resulting in stimulated emission of laser radiation.

Laser radiation from each region is coupled serially to a reflective end mirror disposed adjacent an endmost region of the length of material. A top reflective mirror is disposed horizontally adjacent the regions opposite the bottom reflective mirror. Light from the end mirror passes back and forth between the top and bottom reflective mirrors in a beam path until the light beam thus formed impinges on a partially reflective mirror disposed adjacent an end of the active material opposite the first end mirror. This partially reflective mirror forms an output mirror of an external cavity while the first end mirror forms the reflective side of the external cavity.

One or more segments or regions can be pumped. The advantage of using multiple segments is that the total thermal load is spread over a larger area than that for a singly pumped region and the total net gain is increased over that for a single pumped region. The power capability can be increased by more than one hundred times that of a single element by the methods of the present invention.

Note that the invention provides a novel mechanism for converting a plurality of parallel edge emitting beams, i.e., the beams from an array of optical pump sources, such as laser diodes, into a single beam of multiple excited regions combined in series to produce a circular or spherical emitter.

In another aspect, the methods of the invention are employed to form an optical amplifier by simply eliminating the laser mirrors at each end of the path.

BRIEF DESCRIPTION OF THE DRAWINGS

FIG. 2 is a schematic drawing of an alternate embodiment of the invention which includes a series of gain elements inside an optical resonator.

DESCRIPTION OF THE PREFERRED EMBODIMENT

Figure 1:
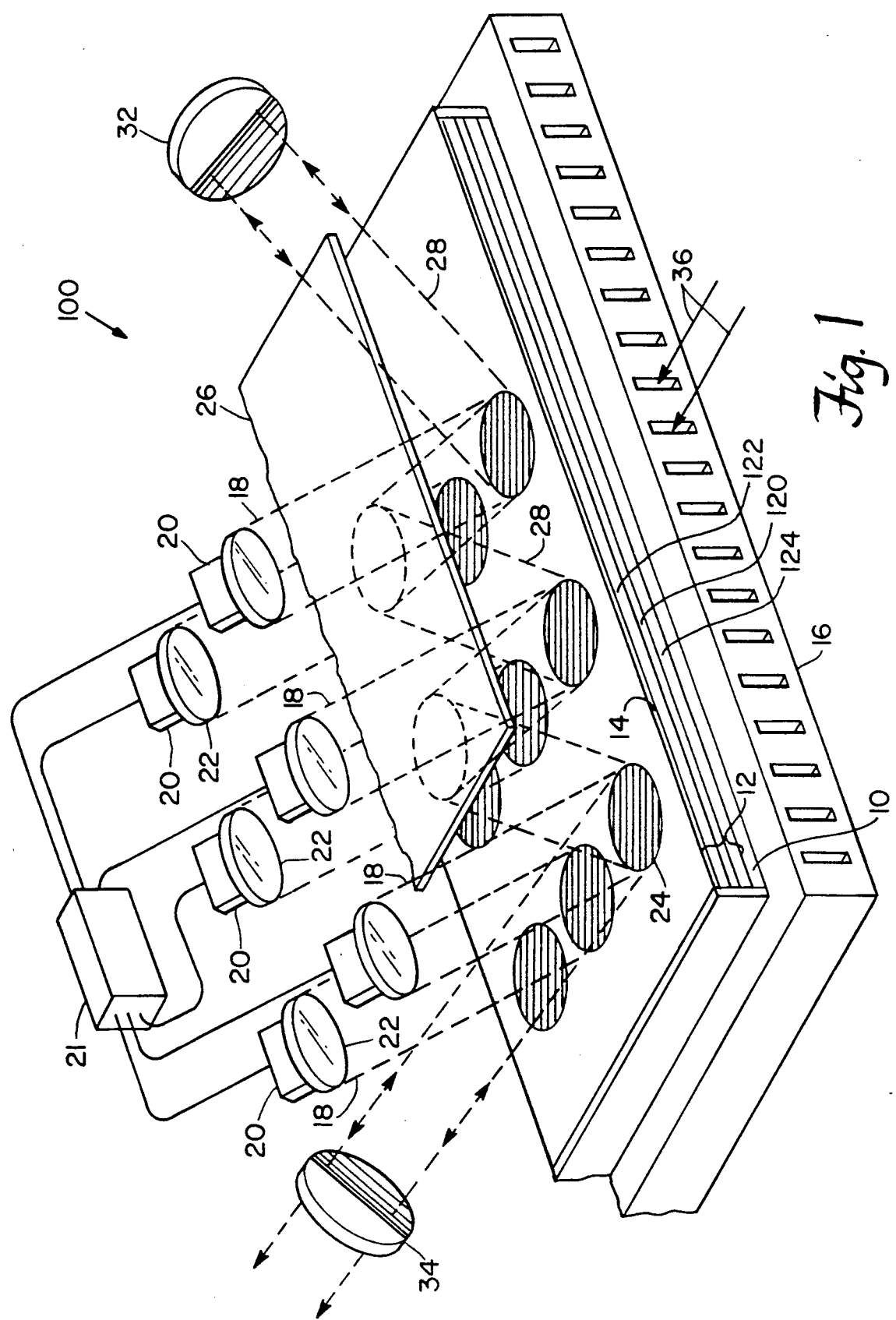
FIG. 1 is a schematic drawing of one embodiment of the laser system of the present invention showing a two-dimensional implementation of the pumping system.

One embodiment of the semiconductor laser system 100 of the present invention is illustrated in FIG. 1. As indicated, a mirror 10 is disposed on one side of a flat wafer 12 of active semiconductor laser material, such as GaAs, 120 sandwiched between layers 122,124 of AlGaAs forming a heterostructure.

The active regions 24 are laterally isolated from the remainder of the wafer by damaging or removing the semiconductor material around each segment. An etching or ion bombardment process may be used for this purpose. The mirror 10 may be directly formed on the wafer 12 by evaporation, deposition, sputtering, or equivalent technique. The mirror may be formed of a quantum well or multiple quantum well (MQW) structure. The top side of the wafer 12 is coated with an anti-reflective coating 14 for the operating wavelength of the laser system 100. The bottom mirror 10 is preferably bonded to a microchannel cooler or other heat sink 16 formed of sapphire, silicon or other good heat conductive material. Coolant flow is in the direction of arrows 36. Radiation 18 from a two-dimensional array of optical pump sources 20, powered by power supply 21, is focused by an array of lenses 22 to excite multiple segments 24 of the active or gain medium semiconductor material 120.

A second mirror 26 is positioned above the wafer 12 to reflect a laser beam 28 thus formed back and forth between bottom mirror 10 and mirror 26 in a path that passes through each of the multiple segments 24 of excited semiconductor material. A further set of mirrors 32 and 34 are positioned at each end of the path 30 to form the ends of an external cavity laser resonator. Mirror 32 is a totally reflective end mirror which reflects beam 28 back along its path. Mirror 34 is an external cavity output mirror which is partially reflective.

The chip of semiconductor material can be bulk semiconductor, a heterostructure, or a quantum well or MQW structure formed of well-known semiconductor material, such as Group III-V or II-VI material. Preferably layers 124, 120, 122 comprise a quantum well or multi-quantum well structure of GaAlAs/GaAs/GaAlAs. In preferred embodiments, the structure is grown to a thickness of a few micrometers to a few tens of micrometers and clad with GaAlAs layers of such a composition that it is transparent to both pump and laser wavelengths. Such cladding reduces surface non-radiative recombination and thereby the threshold for the laser is not unduly increased. Many other structures and materials consistent with this invention may also be used.

In preferred embodiments, the multiple segments of excited semiconductor material are spatially matched to the spatial mode of the external cavity laser resonator in order to achieve the maximum power extraction efficiency in the $TEM_{00}$ mode.

The semiconductor gain material 120 should be uniformly excited throughout its volume by the pump sources 20. This may be accomplished, for example, by a combination of optical bleaching by the pump source and control of the absorption coefficient by altering the composition of the gain material.

The semiconductor material can be pumped optically, electrically, or with an electron beam. In preferred embodiments, the pump sources are semiconductor diode lasers or laser arrays, made of GaAlAs, for example. Alternately, the semiconductor diode lasers or laser arrays may comprise an array of surface emitting devices.

Any type of external resonator geometry known to those skilled in the art may be used, including unstable resonators. Grating or etalon tuners can be used to control or tune the output wavelength of the device.

The region between the heat sink 16 and the gain region 120 should be made as thin as possible to maximum heat extraction. In general, it is necessary to have the thickness of each gain segment greater than about one optical wavelength so that any axial mode of the resonant cavity will see a spatially uniform gain and the relative path differences between segments becomes unimportant.

A linear or one-dimensional array of pump sources may be used when a smaller area of semiconductor surface is being pumped.

A variation of the above embodiments is shown in FIG. 2. In this embodiment, a series of disk-shaped semiconductor laser gain elements 38 is embedded in or bonded onto or otherwise disposed in a heat sink body 40 disposed between two mirrors external cavity reflective mirror 42 and external cavity output mirror 44. An array of pump sources 46 associated with an array of focusing mirrors 48 is adapted to excite the multiple gain elements 38. In preferred embodiments, the heat sink apparatus is sapphire. The disk elements can be made non-reflecting by placing them at the Brewster angle for a polarized beam, as is well known in the art, or they can have a non-reflecting coating. The actual geometric path of the resultant beam 50 must take into account the index of refraction of the heat sink material.

Note that in FIG. 2, as in FIG. 1, multiple parallel beams 52 of edge emitting light have been combined into a single beam 50 of circular light comprised of light from a plurality of active lasing segments 38 coupled in series.

The scope of the invention also extends to optical amplifiers. In this embodiment of the invention, the mirrors 32 and 34 in FIGS. 1 and 2 are omitted. Then a beam of light can be amplified along the path 30 in one pass.

Equivalents

It is recognized that modifications and variations of the present invention will occur to those skilled in the art, and it is intended that all such modifications and variations be included within the scope of the claims.

What is claimed is:

1. A semiconductor laser system comprising:
   a) a body of active semiconductor laser material said body extending longitudinally in a plane;
   b) a first mirror disposed on one side of said body;
   c) a second mirror disposed opposite a second side of said body;
   d) an array of pump sources disposed adjacent to said body at an angle to said plane for pumping multiple laterally spaced segments of said body with radiation of a wavelength to generate a laser beam of light through said body; and wherein
   said second mirror reflects said laser beam back and forth between said first mirror and said second mirror in a path that passes through a plurality of said multiple laterally spaced segments of active semiconductor material; and
   e) a further set of mirrors disposed at each end of said path for reflecting said laser beam back through said path, whereby said set of mirrors form the ends of an external cavity laser resonator operating in a predetermined spatial mode such that said multiple spaced segments are spatially matched to said spatial mode to achieve maximum power extraction of said mode.

2. The system of claim 1 wherein said body is taken from the group which comprises a bulk semiconductor, a heterostructure, or a quantum well structure with said segments being isolated from each other such that light is not propagated laterally through the active material from one segment to another.

3. The system of claim 1 wherein said semiconductor body is taken from the group comprising: a heterostructure, a bulk semiconductor, or a quantum well structure.

4. The system of claim 1 wherein said body is a planar semiconductor wafer formed as a quantum well structure that is transparent to the wavelength of the pump source and the wavelength of the laser beam.

5. The system of claim 1 wherein said body is a planar semiconductor wafer which has an antireflection coating on the side facing said second mirror.

6. The system of claim 1 wherein said first mirror is coated onto said wafer.

7. The system of claim 1 wherein said first mirror is bonded to a heat sink.

8. The system of claim 1 wherein said first mirror is bonded to a microchannel cooling heat sink.

9. The system of claim 1 wherein said pump sources are taken from the group comprising electrically, optically, or electron beam type pumps.

10. The system of claim 1 wherein said pump sources are from the group comprising: semiconductor diode lasers or laser arrays.

11. The system of claim 10 wherein said pump sources are surface emitting devices.

12. The system of claim 1 wherein said pump sources are from the group comprising: GaAlAs diode lasers or laser arrays.

13. The system of claim 1 wherein said external cavity laser resonator is unstable.

14. The system of claim 1 wherein said external cavity laser resonator further comprises tuners from the group comprising: gratings or etalon tuners to tune the laser beam wavelength of the system.

15. A method of forming a semiconductor laser system comprising the steps of:
   a) providing a body of semiconductor laser material extending in a plane;
   b) disposing a first mirror on one side of said body;
   c) disposing a second mirror on an opposite side of said body;
   d) pumping multiple laterally spaced segments of said semiconductor material with a non-coherent light beam to excite the laser material and produce a laser beam passing along a first path which extends through said body; and
   e) disposing a second mirror in the first path to reflect the laser beam back and forth along another path between said first mirror and said second mirror and through a plurality of the laterally spaced segments of excited semiconductor material.

16. The method of claim 15 including disposing a further set of mirrors at each end of said another path to reflect said laser beam back through said another path to form an external cavity laser resonator.

17. The method of forming an optical amplifier comprising the steps of:
   a) providing a wafer of semiconductor laser material;
   b) disposing a first mirror on one side of said wafer;
   c) exciting multiple laterally spaced segments of said semiconductor material to produce laser radiation along a laser light beam path; and
   d) disposing a second mirror in the path to reflect the light beam back and forth between said first mirror and said second mirror in a path that passes through a plurality of the multiple laterally spaced segments of excited semiconductor material, whereby said laser light beam is amplified.

18. A semiconductor laser system comprising:
   a) a series of wafers of semiconductor laser material, said wafers disposed opposite each other at an angel to each other;
   b) an array of pump sources for exciting multiple laterally spaced segments of respective wafers by respective sources with an optical beam at a first wavelength and generating a laser beam at a second wavelength; and
   c) first and second sets of mirrors on opposite ends of said wafers for reflecting said laser beam back and forth in a path that passes through each of a plurality of the said multiple laterally spaced segments of said excited semiconductor material, whereby said mirrors form an external cavity laser resonator operating in a predetermined spatial mode.

19. The system of claim 18 wherein said semiconductor wafers are from the group comprising: bulk semiconductors, heterostructures, or quantum well structures; and the segments are electrically isolated from one another.

20. The system of claim 18 wherein said semiconductor wafers are multiple quantum well structures of GaAs/GaAlAs grown to a thickness of a few to tens of microns and clad with GaAlAs of such a composition that it is transparent to both the first and second wavelengths.

21. The system of claim 18 wherein said wafers have antireflection coatings.

22. The system of claim 18 wherein said laser beam is polarized and said wafers are placed at the Brewster angle with respect to the polarization of said laser beam.

23. The system of claim 18 wherein said segments of excited semiconductor material are spatially matched to the spatial mode of said external cavity laser resonator.

24. The system of claim 18 wherein said wafers are embedded in heat sink apparatus.

25. The system of claim 18 wherein said wafers are bonded onto heat sink apparatus.

26. The system of claim 25 wherein said heat sink apparatus is sapphire.

27. The system of claim 25 wherein said pump sources are adapted to pump said semiconductor material optically.

28. The system of claim 18 wherein said pump sources pump said semiconductor material electrically.

29. The system of claim 18 wherein said pump sources pump said semiconductor material with an electron beam.

30. The system of claim 18 wherein said pump sources are from the group comprising: semiconductor diode lasers or laser arrays.

31. The system of claim 18 wherein said pump sources are from the group comprising: semiconductor diode lasers or laser arrays; fabricated as surface emitting diodes.

32. The system of claim 18 wherein said pump sources are from the group comprising: GaAlAs diode lasers or laser arrays.

33. The system of claim 18 wherein the wafers are disposed in a heat dissipating body and said external cavity laser resonator is unstable.

34. The system of claim 18 wherein said external cavity laser resonator further comprises tuners from the group comprising gratings or etalon tuners to tune the second wavelength.

35. A method of transforming a plurality of beams of light from an array of diode light emitters into a single laser beam of light comprising the steps of:
a) exciting respective multiple laterally spaced segments of an active lasing material with said array of diode light emitters to produce stimulated emission from each of said laterally spaced segments; and
b) combining said emissions in series to produce said single laser beam.

36. A laser system comprising:
a) an array of diode light emitters for emitting beams of light;
b) a series of active lasing material, each disposed at an angle in the path of a respective one of said beams of light for emitting light in response to stimulation from said light emitters;
c) coupling means for combining the light emitted by each said material in series to form a single laser beam of light.

* * * * *

UNITED STATES PATENT AND TRADEMARK OFFICE
CERTIFICATE OF CORRECTION

PATENT NO. : 5,131,002
DATED : July 14, 1992
INVENTOR(S) : Aram Mooradian

It is certified that error appears in the above-identified patent and that said Letters Patent is hereby corrected as shown below:

Col. 1, first paragraph, insert:

---<u>Government Support</u>

This invention was made with government support under Contract No. F19628-85-C-0002 by the U.S. Government. The government has certain rights in the invention.---

Signed and Sealed this

Twenty-first Day of September, 1993

Attest:

BRUCE LEHMAN

Attesting Officer     Commissioner of Patents and Trademarks